(12) United States Patent
Lim et al.

(10) Patent No.: US 9,705,075 B2
(45) Date of Patent: Jul. 11, 2017

(54) COBALT (CO) AND PLATINUM (PT)-BASED MULTILAYER THIN FILM HAVING INVERTED STRUCTURE AND METHOD FOR MANUFACTURING SAME

(75) Inventors: Sang Ho Lim, Gyeonggi-do (KR); Tae Young Lee, Seoul (KR); Seong Rae Lee, Seoul (KR); Dong-Su Son, Daejeon (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/403,058

(22) PCT Filed: Jun. 26, 2012

(86) PCT No.: PCT/KR2012/005035
§ 371 (c)(1),
(2), (4) Date: Nov. 21, 2014

(87) PCT Pub. No.: WO2013/176332
PCT Pub. Date: Nov. 28, 2013

(65) Prior Publication Data
US 2015/0115379 A1    Apr. 30, 2015

(30) Foreign Application Priority Data

May 22, 2012    (KR) .................. 10-2012-0054188

(51) Int. Cl.
*H01L 43/10* (2006.01)
*G01R 33/09* (2006.01)
(Continued)

(52) U.S. Cl.
CPC ............ *H01L 43/10* (2013.01); *G01R 33/098* (2013.01); *H01F 10/3286* (2013.01);
(Continued)

(58) Field of Classification Search
CPC ......... H01L 43/10; H01L 43/02; H01L 43/12; G01R 33/098; H01F 10/3286
See application file for complete search history.

(56) References Cited

U.S. PATENT DOCUMENTS 5,568,115 A    10/1996  Kano et al.
8,274,811 B2    9/2012  Zhang et al.
(Continued)

FOREIGN PATENT DOCUMENTS

CN    1042025    5/1990
CN    1054450    9/1991
(Continued)

OTHER PUBLICATIONS

Lee, T., et al., High post-annealing stability in [Pt/Co] multilayers, Journal of Applied Physics, 2013, p. 216102, vol. 113.
(Continued)

*Primary Examiner* — Long Pham
(74) *Attorney, Agent, or Firm* — IP & T Group LLP (57) ABSTRACT

The present invention relates to a cobalt (Co) and platinum (Pt)-based multilayer thin film having a novel structure and perpendicular magnetic anisotropy, and to a fabrication method thereof. More specifically, the invention relates to a cobalt and platinum-based multilayer thin film having perpendicular magnetic anisotropy (PMA), which includes thin cobalt layers and thin platinum layers alternately deposited over a substrate, and has an inverted structure in which a thickness of the thin cobalt layers is greater than that of the thin platinum layers, and to a fabrication method thereof. The cobalt and platinum-based multilayer thin film has a new structure in which the thickness of a magnetic thin layer is greater than that of a non-magnetic thin layer. The multilayer thin film may be easily applied as a free layer and a pinned layer in a magnetic tunnel junction by controlling the perpendicular magnetic anisotropy energy depending on (Continued)

the thickness ratio of the layers. Also, the multilayer thin film has excellent thermal stability, and thus maintains its PMA energy density even after being subjected to a heat treatment process. In addition, it enables a fine amount of in-plane magnetic anisotropy to be formed by heat treatment so as to reduce the critical current density required for magnetization switching. Therefore, it may be advantageously used for high-performance and high-density MRAM.

15 Claims, 6 Drawing Sheets (51) Int. Cl.
    *H01L 43/02* (2006.01)
    *H01L 43/12* (2006.01)
    *H01F 10/32* (2006.01)
    *H01F 10/12* (2006.01)

(52) U.S. Cl.
    CPC .............. *H01L 43/02* (2013.01); *H01L 43/12* (2013.01); *H01F 10/123* (2013.01)

(56) References Cited

U.S. PATENT DOCUMENTS

| | | | |
|---|---|---|---|
| 8,920,947 | B2 | 12/2014 | Zhang et al. |
| 2003/0235717 | A1 | 12/2003 | van de Veerdonk et al. |
| 2011/0122525 | A1* | 5/2011 | Nemoto ............... G11B 5/65 360/75 |
| 2012/0012953 | A1 | 1/2012 | Lottis et al. |
| 2012/0299134 | A1 | 11/2012 | Jan et al. |
| 2014/0284742 | A1 | 9/2014 | Sawada et al. |
| 2014/0346518 | A1* | 11/2014 | Kariyada ............. G11C 11/161 257/53 |
| 2015/0115379 | A1 | 4/2015 | Lim et al. |

FOREIGN PATENT DOCUMENTS

| | | |
|---|---|---|
| CN | 1140320 | 1/1997 |
| JP | 3042878 | 3/2000 |
| JP | 2003-228815 | 8/2003 |
| KR | 1020020060483 | 7/2002 |
| KR | 1020080048151 | 6/2008 |
| KR | 1020090037970 | 4/2009 |
| KR | 1020110058750 | 6/2011 |
| KR | 101287370 | 7/2013 |
| WO | WO 2013176332 | 11/2013 |

OTHER PUBLICATIONS

Lee, T., et al., Effects of Co layer thickness and annealing temperature on the magnetic properties of inverted [Pt/Co] multilayers, Journal of Applied Physics, 2013, p. 173909, vol. 114.
Office Action issued by the State intellectual Property Office on Jun. 1, 2016.
Yuan, Fu-Te, et al., Enhancement of perpendicular coercivity in L11 CoPt thin films by replacement of Co with Cu, Journal of Applied Physics, 2010, pp. 113909, vol. 108.
Yuan, Fu-Te, et al., Coercivity enhancement in L11 Co50—xCuxPt50 thin films, Journal of Applied Physics, 2011, pp. 07B714, vol. 109.
Nishimura, Naoki, et al., Magnetic tunnel junction device with perpendicular magnetization films for high-density magnetic random access memory, Journal of Applied Physics, Apr. 2002, pp. 5246-5249, vol. 91, No. 8.
Shima, T., et al., Low-temperature fabrication of L10 ordered FePt alloy by alternate monatomic laver deposition, Applied Physics Letters, Jan. 2002, pp. 288-290, vol. 80, No. 2.
Zeper, W. B., et al., Hysteresis, microstructure, and magneto-optical recording in Co/Pt and Co/Pd multilayers, Journal of applied physics, 1991, pp. 2264-2271, vol. 70, No. 4.
Ikeda, S., et al., A perpendicular-anisotropy CoFeB—MgO magnetic tunnel junction, Nature Materials, 2010, pp. 721-724, vol. 9.
S. Bandiera et al., Enhancement of perpendicular magnetic anisotropy through reduction of Co—Pt interdiffusion in (Co/Pt) multilayers 100, 142410, 2012.

* cited by examiner

COBALT (CO) AND PLATINUM (PT)-BASED MULTILAYER THIN FILM HAVING INVERTED STRUCTURE AND METHOD FOR MANUFACTURING SAME

This application is a national stage application of PCT/KR2012/005035 filed on Jun. 26, 2012, which claims priority of Korean patent application number 10-2012-0054188 filed on May 22, 2012. The disclosure of each of the foregoing applications is incorporated herein by reference in its entirety.

TECHNICAL FIELD

The present invention relates to a cobalt (Co) and platinum (Pt)-based multilayer thin film having a novel structure and perpendicular magnetic anisotropy, and to a manufacturing method thereof.

BACKGROUND ART

In an effort to overcome the volatility of dynamic random access memory (hereinafter referred to as DRAM), which is a semiconductor memory device that is widely used in electronic devices such as personal computers (PCs) and mobile phones, studies on magnetic random access memory (hereinafter referred to as MRAM) having non-volatile memory characteristics have been actively conducted. As used herein, the term "non-volatile memory" refers to the property that requires a specific amount of power only to read and write information and that keeps written information without requiring separate power even when a power supply is blocked. Particularly, in recent years, the density of integration of the DRAM reached a limit, and thus the MRAM has been considered as a substitute for the DRAM. Therefore, in the related industrial fields, the research and development of the MRAM has been actively conducted.

Studies on the MRAM have been conducted since the early 2000s, and early studies were focused mainly on changing the resistance of tunneling magneto-resistance (hereinafter referred to as TMR) devices by reversing magnetization using a magnetic field created by application of an electric current. However, this TMR-based MRAM device has a shortcoming in that, as the size of the device decreases, the amount of writing current greatly increases, making it difficult to realize large-scale, densely integrated memory. Due to this shortcoming, an MRAM technology based on spin-transfer torque magnetization switching was introduced. It is a type of current-induced magnetization switching, and is based on a method of switching magnetization using a spin-transfer torque (hereinafter referred to as STT) generated by applying a current to a magnetic thin film. The MRAM based on this method is referred to as STT-MRAM. Spin-transfer torque magnetization switching provides various advantages, including high integration density, wide write window and low power consumption, compared to existing magnetic field-induced magnetization switching.

Prior studies on the STT-MRAM were focused mainly on magnetic tunnel junctions (hereinafter referred to as MTJs) with in-plane magnetic anisotropy. Recently, in-plane magnetic tunnel junctions (iMTJs), which have a relatively low critical current density while maintaining their thermal stability in nanosized magnetic cells, were also developed. Such results were mostly obtained in MgO-based structures having an exchange-coupled trilayer including a free layer and a pinned layer, but a MTJ that requires a lower critical current density (e.g., 1 MA/cm$^2$ or less) is required to realize a highly integrated MRAM device for commercial use.

In view of this disadvantage of iMTJ, an MJG with perpendicular magnetic anisotropy (hereinafter referred to as PMA) has a very big advantage in that the critical current density required for magnetization switching is low. This is because the iMTJ requires additional torque to overcome a demagnetizing field (2n $M_s$, where $M_s$=saturation magnetization) during magnetization switching, and thus it is difficult to lower the critical current density. For this perpendicular MTJ (pMTJ), it is most important to develop materials and structures, which have excellent PMA properties (PMA energy density=about $10^7$ erg/cc). However, from the view point of magnetostatic energy, PMA should overcome a very high demagnetizing field, and thus it is fundamentally difficult to develop materials and structures, which have excellent PMA properties.

PMA can be largely divided into PMA caused by interfaces, and PMA caused by bulk properties. Until now, three kinds of materials with perpendicular magnetic anisotropy (PMA) have been mainly studied, including rare earth-3d transition metal amorphous alloys, multilayer thin films such as CoPd and CoPt [W. B. Zeper et al., J. Appl. Phys. 70, 2264 (1991)], and intermetallic compounds, such as FePt, CoPt, which have the $L1_0$ structure [T. Shima et al., Appl. Phys. Lett. 80, 288 (2002)].

However, rare earth-3d transition metal amorphous alloys have problems in that the PMA energy density is insufficient and in that crystallization occurs even at a relatively low temperature (about 300° C.) to rapidly reduce the PMA properties. On the other hand, intermetallic compounds such as FePt and CoPt, which have the $L1_0$ structure, are known as materials having the best characteristics up to date, because the PMA energy density is sufficiently high and the temperature characteristics are also good. However, the intermetallic compounds with the $L1_0$ structure also have a problem in that these compounds are not suitable for temperature conditions that are used in current memory device processes, because a temperature higher than 600° C. is required to form an intermetallic compound having a high long-range order known as the most important factor for PMA. In addition, there is a problem in that it is not easy to design a seed layer and a buffer layer, which are required to form the (001) texture essential for perpendicular magnetic anisotropy (PMA). Finally, multilayer thin-film structures such as CoPd and CoPt have sufficient PMA energy density, but have a problem in that these multilayer thin-film structures are easily broken down at a temperature ranging from about 350° C. to 450° C., which is the heat treatment temperature used in current memory fabrication processes, and thus the PMA properties are reduced or lost.

Accordingly, due to the above-described problems occurring in the art, there is an urgent need for a new material and structure, which are suitable for the heat treatment temperature that is used in current memory fabrication processes, and at the same time, has sufficient perpendicular magnetic anisotropy density.

DISCLOSURE

Technical Problem

Therefore, it is a first object of the present invention to provide a cobalt and platinum-based multilayer thin film, which securely maintains its structure and properties even in the heat-treatment temperature range that is used in current memory fabrication processes, and at the same time, has excellent perpendicular magnetic anisotropy (PMA) in order to realize a perpendicular magnetic tunnel junction (pMTJ).

A second object of the present invention is to provide a method for fabricating the above cobalt and platinum-based multilayer thin film.

Technical Solution

To achieve the first object, the present invention provides a cobalt and platinum-based multilayer thin film having perpendicular magnetic anisotropy (PMA), which includes thin cobalt layers and thin platinum layers alternately deposited on a substrate, and has an inverted structure in which the thickness of the thin cobalt layers is greater than that of the thin platinum layers.

In an embodiment of the present invention, the ratio of the thickness of the thin cobalt layers to that of the thin platinum layers in the cobalt and platinum-based multilayer thin film may be more than 1:1 but less than 3:1.

In another embodiment of the present invention, the thickness of each of the thin platinum layers in the cobalt and platinum-based multilayer thin film may range from 0.15 nm to 0.25 nm.

In still another embodiment of the present invention, the thin cobalt layer and the thin platinum layer in the cobalt and platinum-based multilayer thin film may be deposited once or may be alternately deposited 2-10 times.

In still another embodiment of the present invention, the substrate may be any one selected from the group consisting of a silicon substrate, a glass substrate, a sapphire substrate and a magnesium oxide substrate.

In still another embodiment of the present invention, a buffer layer and a seed layer may be deposited between the substrate and the alternately deposited thin cobalt layer and thin platinum layer, and a protective layer may be deposited on the alternately deposited thin cobalt layer and thin platinum layer.

In still another embodiment of the present invention, the buffer layer, the seed layer or the protective layer may be made of Au, Cu, Pd, Pt, Ta, Ru, or an alloy of two or more thereof.

To achieve the second object, the present invention provides a method for fabricating a cobalt and platinum-based multilayer thin film, the method including the steps of: (a) depositing on a substrate a cobalt and platinum-based multilayer thin film having an inverted structure in which the thickness of thin cobalt layers is greater than that of thin platinum layers; and (b) heat-treating the deposited multilayer thin film.

In an embodiment of the present invention, the heat-treating may be performed at a temperature between 150° C. and 500° C.

In an embodiment of the present invention, the method may further include, before step (a), a step of sequentially depositing a buffer layer and a seed layer on the substrate.

In a still embodiment of the present invention, the method may further include, after step (a) and before step (b), a step of depositing a protective layer.

Advantageous Effects

A cobalt and platinum-based multilayer thin film having an inverted structure according to the invention has a new structure in which the thickness of a magnetic thin layer is greater than that of a non-magnetic thin layer. In the development of high-density MRAM, the multilayer thin film of the present invention can be easily applied as a free layer and a pinned layer in a magnetic tunnel junction (MTJ) by controlling the PMA energy density depending on the thickness ratio of the magnetic thin layer and the non-magnetic thin layer. Also, the multilayer thin film of the present invention has excellent thermal stability, and thus maintains its PMA energy density even after being subjected to a heat treatment process. In addition, it enables a fine amount of in-plane magnetic anisotropy to be formed by heat treatment so as to reduce the critical current density required for magnetization switching. Therefore, it can be advantageously used for high-performance and high-density MRAM.

BRIEF DESCRIPTION OF DRAWINGS

FIG. 2b is a graph showing the profile of each of components for the portions indicated by red dotted lines in FIG. 2a.

FIG. 3a: before heat treatment; FIG. 3b: after heat treatment at 300° C.; and FIG. 3c: after heat treatment at 450° C.

FIG. 4a: before heat treatment; FIG. 4b: after heat treatment at 300° C.; and FIG. 4c: after heat treatment at 450° C.

BEST MODE

Hereinafter, the present invention will be described in further detail.

The present invention provides a cobalt and platinum-based multilayer thin film having perpendicular magnetic anisotropy (PMA), which includes thin cobalt layers and thin platinum layers alternately deposited on a substrate, and has an inverted structure in which the thickness of the thin cobalt layers is greater than that of the thin platinum layers.

As described above, the cobalt and platinum-based multilayer thin film according to the prior art has a structure in which the thickness of a thin platinum layer that is a non-magnetic thin layer is greater than that of a thin cobalt layer that is a magnetic thin layer. It is known that PMA in this multilayer thin film according to the prior art occurs at the interface between the thin cobalt layer and the thin platinum layer. The multilayer thin film having this structure has a fatal disadvantage in that the PMA properties of the multilayer thin film before heat treatment are lost while the interface between the thin cobalt layer and the thin platinum layer, which is essential for the exhibition of PMA, is broken down in the heat-treatment temperature range that is used in current memory fabrication processes. This disadvantage makes it difficult to apply the prior cobalt and platinum-based multilayer thin film in the MRAM field. Accordingly, the present inventors have conducted studies while controlling the thickness of a thin cobalt layer (magnetic thin layer) and the thickness of a thin platinum layer (non-magnetic thin layer) over a wide range, and as a result, have found that, when the thickness of the thin cobalt layer is greater than that of the thin platinum layer, unexpected effects are achieved, eased on this finding, the present inventors have completed the present invention.

Therefore, the present invention provides a cobalt and platinum-based multilayer thin film having a structure in which the thickness of a thin cobalt layer that is a magnetic thin layer is greater than that of the thin platinum layer that is a non-magnetic thin layer. This structure in the present invention is referred to as "inverted structure", because the thickness ratio of the two layers in this structure is inverted compared to that in the prior art structure in which the thickness of the non-magnetic thin layer is greater than that of the magnetic thin film. As can be seen from the results of examples described later, the multilayer thin film having the inverted structure according to the present invention has an advantage in that, even when it is subjected to a heat treatment process in the heat treatment temperature range that is used in current memory fabrication processes, the PMA properties thereof are maintained intact or further improved. Thus, it has better properties compared to the multilayer thin film according to the prior art.

In the cobalt and platinum-based multilayer thin film according to the present invention, the ratio of the thickness of the thin cobalt layer to that of the thin platinum layer is not limited, as long as the former is thicker than the latter. Preferably, the ratio of the thickness of the thin cobalt layer to that of the thin platinum layer may be more than 1:1 but not more than 3:1. If the ratio of the thickness is not more than 1:1, the resulting structure is not an inverted structure, but is merely the same structure as that of the multilayer structure according to the prior art, and thus the characteristic effects of the present invention cannot be achieved. If the ratio of the thickness is more than 3:1, there will be problems in that the PMA energy density decreases and the PMA properties are greatly deteriorated during a heat treatment process.

In the multilayer thin film according to the present invention, the thickness of each of the thin platinum layers may range from 0.15 nm to 0.25 nm, and in this case, the thickness of each of the thin cobalt layers will be a thickness that satisfies the thickness ratio range, that is, a thickness ranging from more than 0.15 nm to 0.75 nm. If the thickness of each of the thin platinum layers is less than 0.15 nm, there will be problems in that the PMA energy density decreases and the layer is weak against a heat treatment process, and if the thickness is more than 0.25 nm, there will be a problem in that the PMA properties are rapidly deteriorated during a heat-treatment process.

Meanwhile, in the multilayer thin film having the inverted structure according to the present invention, each of the thin cobalt layers and the thin platinum layers may be deposited once, but the thin cobalt layer and the thin platinum layer are preferably alternately deposited several times in order to ensure better perpendicular magnetic anisotropy. Thus, each of the thin cobalt layer and the thin platinum layer may be deposited 1 to 10 times. However, if each of the layers is deposited more than 10 times, there will be a problem in that, when the resulting multilayer thin film is applied to an actual memory device, the resistance thereof increases, or the critical current value required for magnetization switching increases due to an increase in the volume of the magnetic thin layers, and thus the multilayer thin film is disadvantageous for commercial use.

Thus, when the layers are deposited 1-10 times to have thicknesses in the above-described thickness ranges, the total thickness of the multilayer thin film consisting of the thin cobalt layers and the thin platinum layers will range from 0.3 nm (when the thin cobalt layer and the thin platinum layer, each having a thickness of 0.15 nm, are each deposited once) to 10 nm (when the thin cobalt layer having a thickness of 0.25 nm and the thin platinum layer having a thickness of 0.75 nm are each deposited 10 times).

Meanwhile, the multilayer thin film according to the present invention is deposited on a substrate. The substrate may be made of any one material selected from the group consisting of silicon, glass, sapphire and magnesium oxide, but is not limited thereto. Also, in the multilayer thin film according to the present invention, a buffer layer and a seed layer may be deposited before the thin cobalt layer and the thin platinum layer are deposited on the substrate. Further, after the thin cobalt layer and the thin platinum layer are deposited, a protective layer may further be deposited thereon. The buffer layer, the seed layer or the protective layer may be made of any material that is generally used in the field to which the present invention pertains. For example, the buffer layer, the seed layer or the protective layer may be made of Au, Cu, Pd, Pt, Ta, Ru, or an alloy of two or more thereof, and may be deposited not only as a single layer, but also as a plurality of layers.

Figure 1:
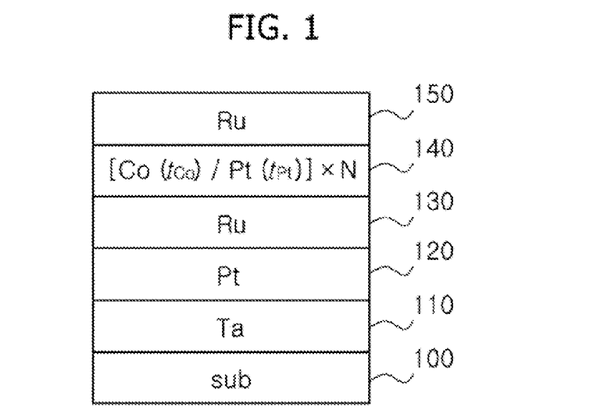
FIG. 1 is a cross-sectional view showing the structure of a multilayer thin film according to an embodiment of the present invention.

FIG. 1 is a cross-sectional view showing the structure of a multilayer thin film according to an embodiment of the present invention. Referring to FIG. 1, a Ta layer 110 serving as a buffer layer is deposited on a substrate 100, and a Pt layer 120 and Ru layer 130 serving as seed layers are deposited thereon. On the seed layers 120 and 130, each of a thin cobalt layer and a thin platinum layer, which constitute a cobalt and platinum-based multilayer thin film 140, are deposited N times to thicknesses of $t_{Co}$ and $t_{Pt}$, respectively. Then, a Ru layer 150 serving as a protective layer is finally deposited.

The present invention also provides a method for fabricating a cobalt and platinum-based multilayer thin film having an inverted structure, the method including the steps of (a) depositing on a substrate a cobalt and platinum-based multilayer thin film having an inverted structure in which the thickness of thin cobalt layers is greater than that of thin platinum layers; and (b) heat-treating the multilayer thin film.

In the method according to the present invention, details regarding the ratio of the thickness of the thin cobalt layers to that of the thin platinum layers, the thickness of each of the thin platinum layers, the number of depositions of each layer, the material of the substrate, the buffer layer, the seed layer and the protective layer, are as described above. However, in the present invention according to the present invention, it is possible to fabricate a multilayer thin film having high thermal stability against a heat treatment process, which definitely differs from that in the prior art, because the multilayer thin film has an inverted structure. Specifically, in the method according to the present invention, the temperature of a heat treatment process that is performed after deposition of each layer may range from 150° C. to 500° C. This implies that the heat treatment process in the present invention can be performed in a significantly wider temperature range compared to the prior art, in view of the fact that the multilayer thin film fabrication process according to the prior art was required to be performed mainly in a low-temperature range due to problems associated with the thermal stability of the thin film structure. Thus, the method according to the present invention enables current memory fabrication processes to be performed in a convenient and cost-effective manner, allows the processes to be modified in various ways, and makes it possible to select various materials. Meanwhile, if the heat treatment temperature is lower than 150° C., no significant problem will occur, but if the heat treatment temperature is higher than 500° C., there may be a problem in that PMA properties are deteriorated.

MODE FOR INVENTION

Hereafter, the present invention will be described in further detail with reference to preferred examples. However, these examples are provided for a better understanding of the present invention, and the scope of the present invention is not limited by these examples.

Fabrication of Multilayer Thin Film

As a substrate, a high-quality (prime grade) wet-oxidation Si/SiO$_2$ substrate was used. On the substrate, a Ta buffer layer (5 nm thickness) was formed, and Pt (10 nm thickness) and Ru (30 nm thickness) seed layers were formed thereon in the close-packed direction. On the buffer layer and seed layers formed as described above, each of a multilayer thin film having an inverted structure according to the present invention, and a multilayer thin film according to the prior art, was formed while changing the thickness of a thin cobalt layer ($t_{Co}$ nm) that is a magnetic thin layer and the thickness of a thin platinum layer ($t_{Pt}$ nm) that is a non-magnetic layer. On each of the formed multilayer thin films, a Ru layer (3 nm thickness) serving as a protective layer was formed.

FIG. 1 shows a cross-sectional view of the multilayer thin film of the present invention, fabricated according to the above-described method. Each of the layers shown in FIG. 1 was deposited by a magnetron sputtering deposition process. The base pressure of a chamber used in the deposition was maintained at $1\times10^{-8}$ Torr or lower, and the deposition was performed at a pressure of about $2\times10^{-3}$ under an atmosphere of argon gas. In the deposition process, all the layers were formed by depositing single element targets (Ta, Pt, Ru and Co) under a vacuum. Particularly, the thin cobalt layer and the thin platinum layer were alternately deposited 6 times. The thickness of the thin layers was controlled by accurately controlling the deposition time based on the deposition rate. To accurately measure the rate of formation of the thin layers, the thicknesses of the deposited thin layers were measured using a surface profiler and scanning transmission electron microscopy (STEM). In addition, for accurate elemental profiling of the fabricated multilayer thin films, energy dispersive x-ray spectroscopy (hereinafter referred to as EDS) was used.

Figure 2A:
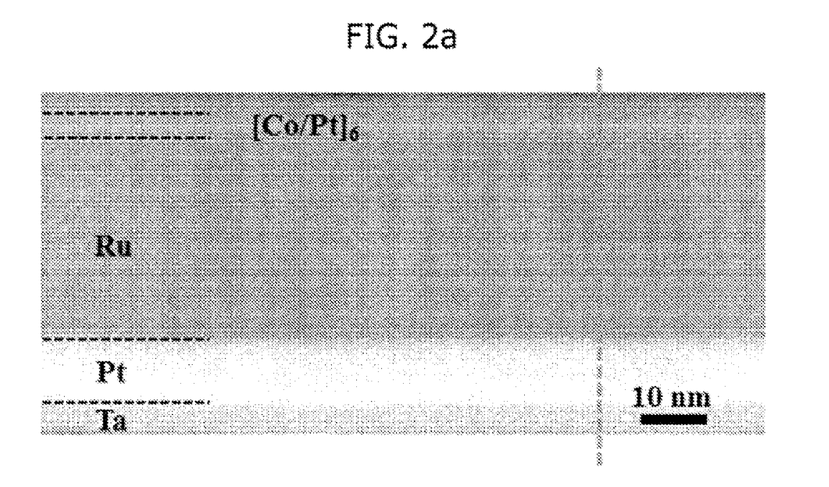
FIG. 2a is a scanning transmission electron microscopy image of [Co (0.32 nm)/Pt (0.2 nm)]$_6$ that is a cobalt and platinum-based multilayer thin film having an inverted structure according to an embodiment of the present invention.
Figure 2B:
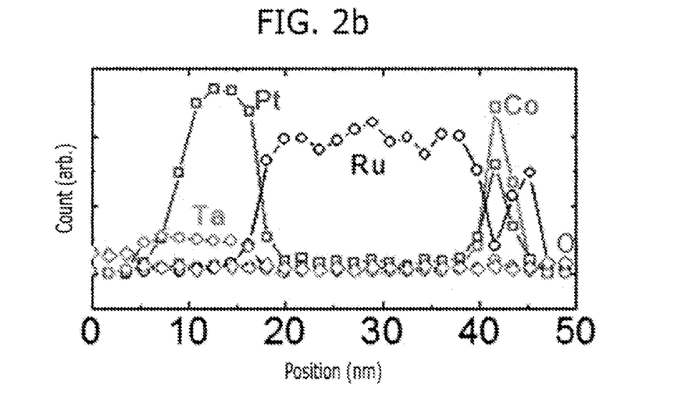

FIG. 2 shows an STEM image and an EDS profiling graph for a multilayer thin film fabricated by sequentially depositing elements according to an embodiment of the present invention. As can be seen in FIG. 2, each of the layers was accurately deposited to a desired thickness, and the component ratio was also accurately consistent with the desired ratio. After deposition of the multilayer thin film, heat treatment was performed under a vacuum of $1\times10^{-6}$ Torr or lower at a temperature of 300 to 500° C. for 1 hour.

Specifically, FIG. 2a is an STEM image of [Co (0.32 nm)/Pt (0.2 nm)]$_6$ that is a cobalt and platinum-based multilayer thin film having an inverted structure according to an embodiment of the present invention. As can be seen therein, each of the layers was deposited to have a uniform thickness. FIG. 2b is a graph showing the profile of each of elemental components for the portions indicated by red dotted lines in FIG. 2a. As can be seen therein, the multilayer thin film was not substantially influenced by oxidation during the deposition process or before or after deposition. This supports that the PMA properties of the multilayer thin film according to the present invention depend directly only on the thicknesses of the thin layers of cobalt and platinum and on the heat treatment temperature.

Figure 3A:
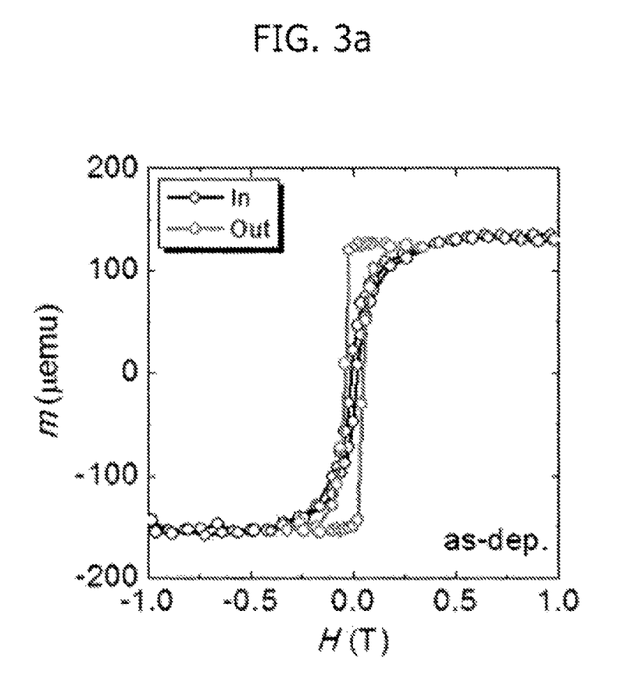
FIGS. 3a to 3c depict magnetic moment (m)-hysteresis (H) curves with heat-treatment temperature for [Co (0.2 nm)/Pt (0.28 nm)]$_6$ that is a multilayer thin film according to the prior art.
Figure 3B:
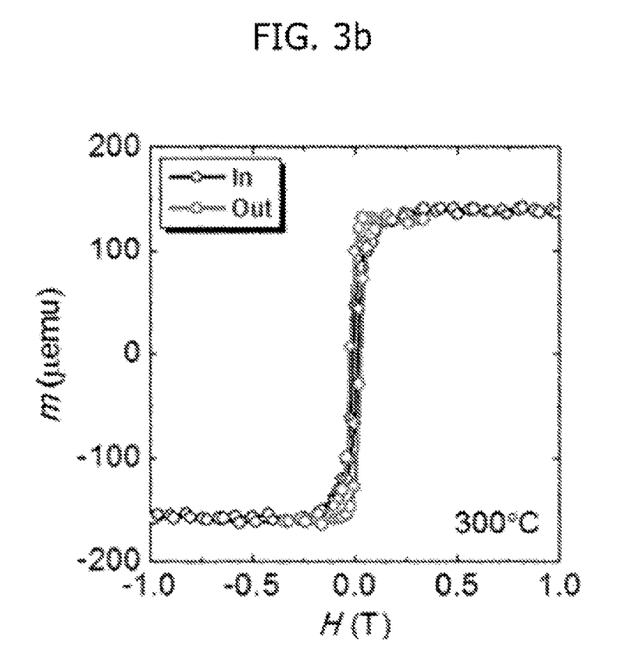
Figure 3C:
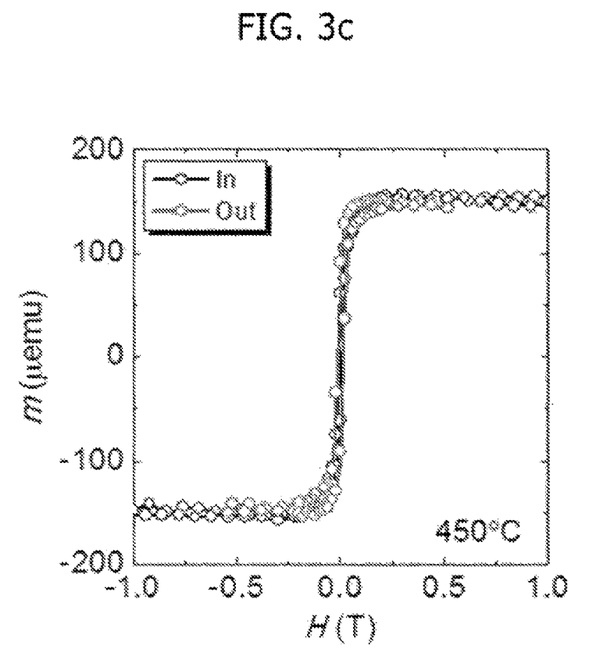
Figure 4A:
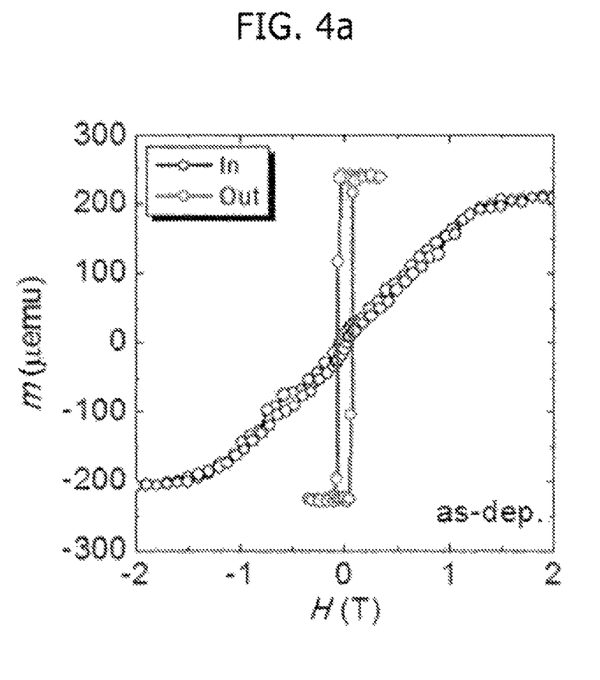
FIGS. 4a to 4c depict magnetic moment (m)-hysteresis (H) curves with heat-treatment temperature for [Co (0.32 nm)/Pt (0.2 nm)]$_6$ that is a cobalt and platinum-based multilayer thin film having an inverted structure according to the present invention.
Figure 4B:
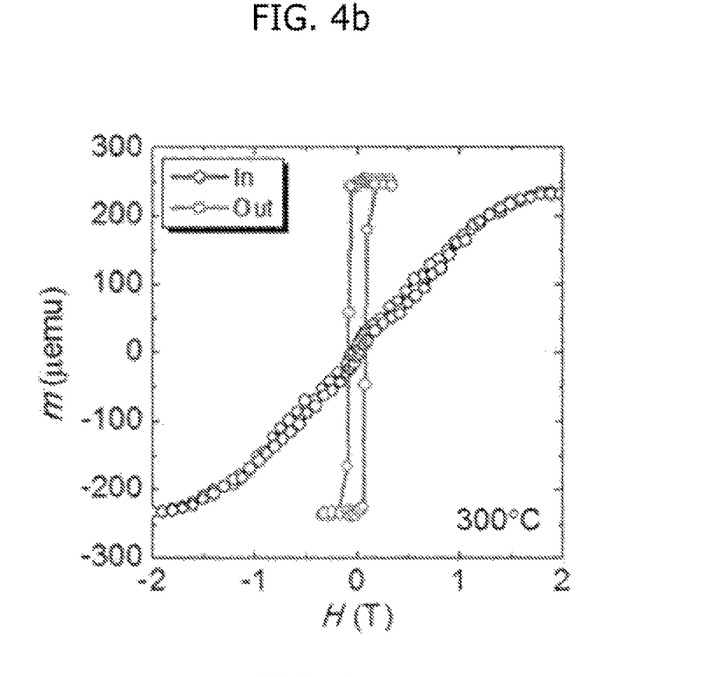
Figure 4C:
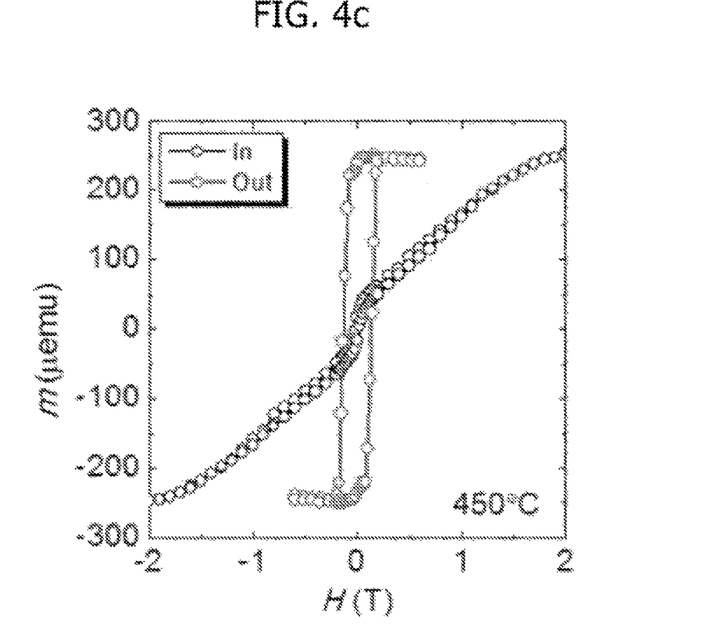

FIGS. 3 and 4 are graphs showing the results of measuring magnetic moment (m)-hysteresis (H) curves for a multilayer thin film of the prior art and a multilayer thin film of the present invention in order to confirm the improved properties of the multilayer thin film fabricated according to the present invention. The m-H hysteresis curves were measured using a vibrating sample magnetometer at normal temperature. In addition, although not shown in the figures, the microstructures of the thin films were analyzed using an X-ray diffractometer and TEM microscopy.

Specifically, FIGS. 3a to 3c depict m-H hysteresis curves with heat treatment temperature (3a: before heat treatment; 3b: after heat treatment at 300° C.; and 3c: after heat treatment at 450° C.) for [Co (0.2 nm)/Pt (0.28 nm)]$_6$, which is a multilayer thin film according to the prior art and has a structure in which the thickness of the non-magnetic thin layer is greater than that of the magnetic thin layer. More specifically, FIGS. 3a to 3c depict m-H hysteresis curves with heat treatment temperature, measured while applying an external magnetic field to the thin film surface in the out-of-plane direction and the in-plane direction.

As can be seen in FIGS. 3a to 3c, the definite PMA properties of the film before heat treatment (as-deposited) were greatly deteriorated after heat treatment, and the coercivity of the film in the out-of-plane direction also decreased. Such results suggest that the PMA properties of the multilayer thin film according to the prior art decrease after heat treatment or with an increase in heat treatment temperature.

Such characteristics are typical characteristics that appear a cobalt-platinum multilayer thin film in which the thickness of the non-magnetic thin layer is greater than that of the magnetic thin layer. It is understood that the PMA properties of the multilayer thin film according to the prior art occur at the interface between the thin cobalt layer and the thin platinum layer, but are lost while the interface between the thin cobalt layer and the thin platinum layer is broken down during heat treatment. Such observation results definitely suggest that there is a limit to the application of the cobalt-platinum multilayer thin film of the prior art to MRAM.

FIGS. 4a to 4c depict m-H hysteresis curves with heat treatment temperature (4a: before heat treatment; 4b: after heat treatment at 300° C.; and 4c: after heat treatment at 450° C.) for [Co(0.32 nm)/Pt (0.2 nm)]$_6$ that is a cobalt and platinum-based multilayer thin film having an inverted structure according to an embodiment of the present invention. As can be seen in FIG. 4a, the m-H hysteresis curve for the multilayer thin film of the present invention before heat treatment indicates more distinct PMA compared to the m-H hysteresis curve of the multilayer thin film of the prior art as shown in FIG. 3a. Thus, it can be seen that, before heat treatment, the multilayer thin film of the present invention has better perpendicular magnetic anisotropy compared to the multilayer thin film of the prior art.

As can be seen in FIG. 4b, the PMA properties of the multilayer thin film of the present invention before heat treatment were substantially maintained even after heat treatment at 300° C., suggesting that the multilayer thin film of the present invention can overcome the problem associated with the decrease in PMA properties after heat treatment, which is the problem of the prior art. Furthermore, as can be seen in FIG. 4c, the PMA properties of the multilayer thin film of the present invention are sufficiently maintained or improved even after heat treatment at 450° C., which is a temperature corresponding to the heat-treatment process temperature that is used in current memory fabrication processes. Also, from the behavior of the in-plane m-H hysteresis curate, it can be seen that, when the deposited multilayer thin film was heat-treated at 450° C., a second phase having in-plane magnetic anisotropy was finely formed. Particularly, from the fact that this in-plane magnetic anisotropy is formed after heat treatment of the multilayer thin film of the present invention, it can be seen that the effect of reducing the critical current value required for perpendicular magnetization switching can also be obtained.

Figure 5A:
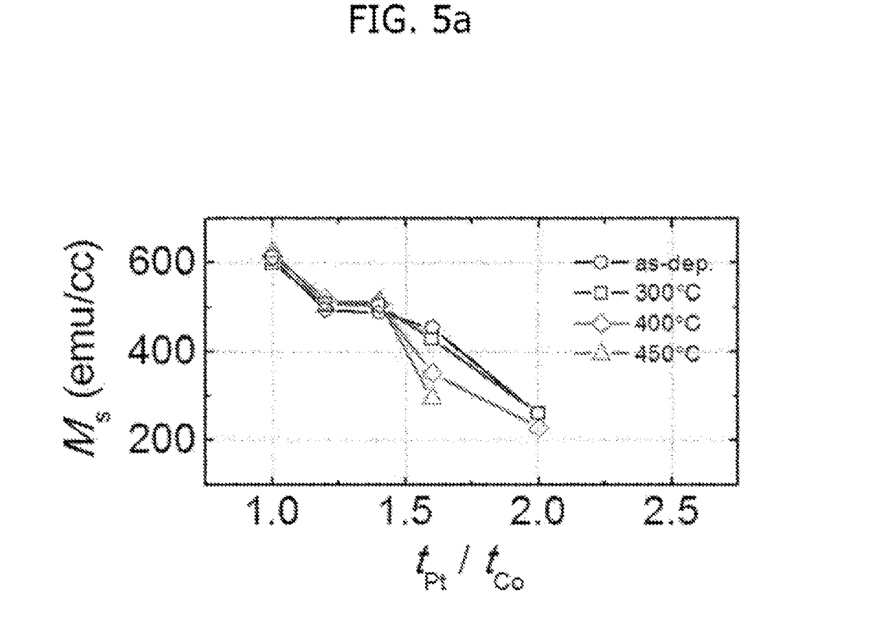
FIGS. 5a and 5b are graphs showing saturation magnetization ($M_s$) (FIG. 5a) and PMA energy density ($K_u$) (FIG. 5b) as a function of the thickness ratio ($t_{Pt}/t_{Co}$) for [Co (0.2 nm)/Pt ($t_{Pt}$ nm)]$_6$ (Co thickness ($t_{Co}$)=fixed to 0.2 nm, and Pt thickness ($t_{Pt}$)=changed) that is a multilayer thin film according to the prior art.
Figure 5B:
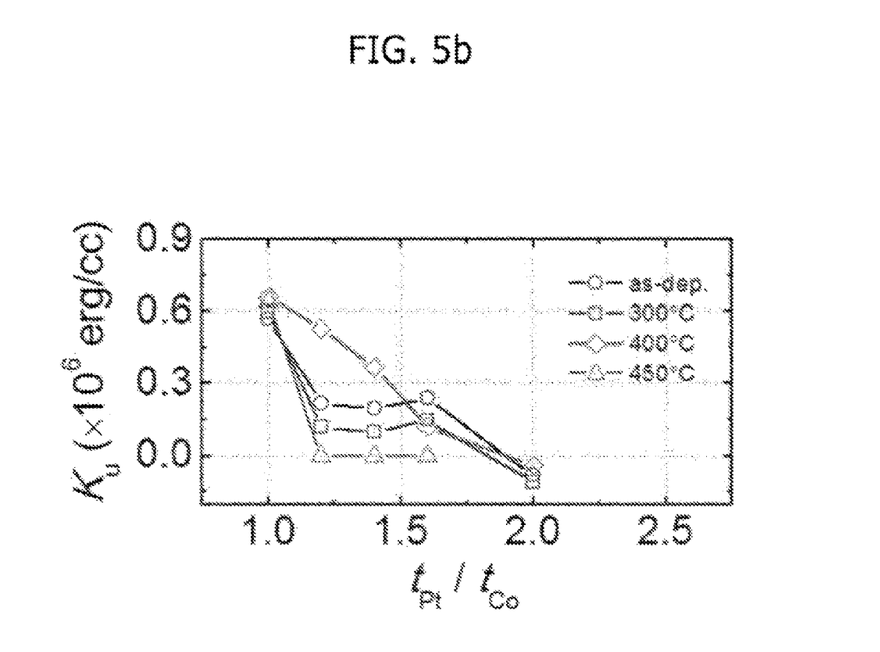
Figure 6A:
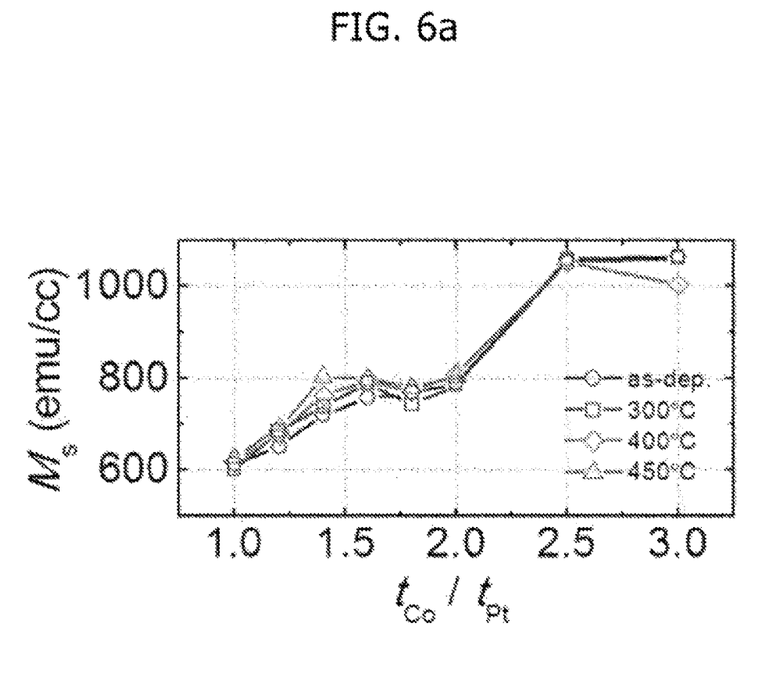
FIGS. 6a and 6b are graphs showing saturation magnetization ($M_s$) (FIG. 6a) and PMA energy density ($K_u$) (FIG. 6b) as a function of the thickness ratio ($t_{Pt}/t_{Co}$) for [Co ($t_{Co}$ nm)/Pt (0.2 nm)]$_6$ (Co thickness ($t_{Co}$)=fixed to 0.2 nm, and Pt thickness ($t_{Pt}$)=changed) that is a cobalt and platinum-based multilayer thin film having an inverted structure according to an embodiment of the present invention.
Figure 6B:
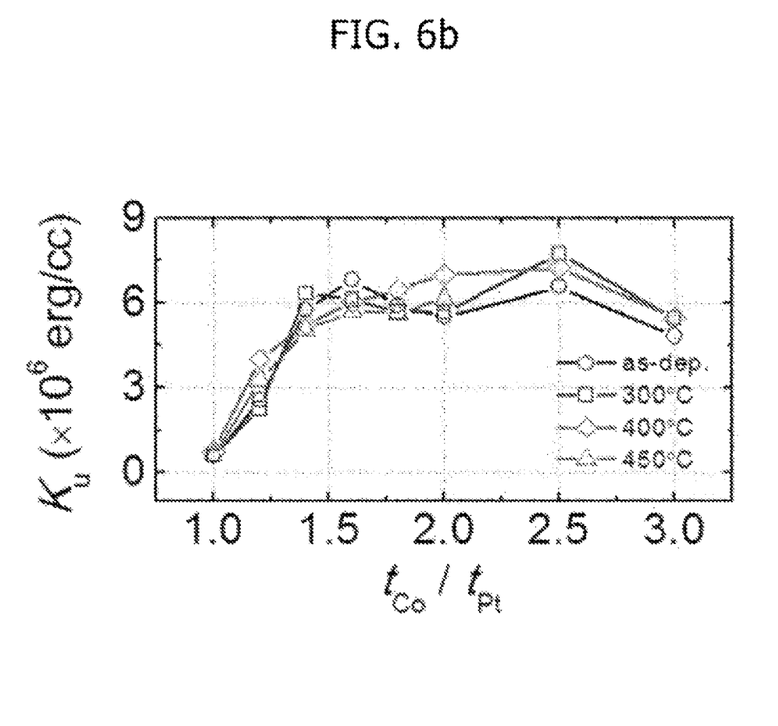

FIGS. 5 and 6 are graphs showing the results of measuring saturation magnetization ($M_s$) and PMA energy density ($K_u$) while changing the thin cobalt layer thickness ($t_{Co}$ nm) and the thin platinum layer thickness ($t_{Pt}$ nm) to various values for [Co ($t_{Co}$ nm)/Pt ($t_{Pt}$ nm)]$_6$ structures, which are the multilayer thin film of the prior art and the multilayer thin film of the present invention, in order to examine the critical significance of the multilayer thin film fabricated according to the present invention.

FIGS. 5a and 5b are graphs showing saturation magnetization ($M_s$) (FIG. 5a) and PMA energy density ($K_u$) (FIG. 5b) as a function of the thickness ratio ($t_{Pt}/t_{Co}$) for [Co (0.2 nm)/Pt ($t_{Pt}$ nm)]$_6$ (Co thickness ($t_{Co}$)=fixed to 0.2 nm, and Pt thickness ($t_{Pt}$)=changed) that is a multilayer thin film according to the prior art. As shown in FIGS. 5a and 5b, as the thickness ratio was closer to that of the cobalt-platinum multilayer thin film of the prior art (that is, the thickness of the non-magnetic thin layer became greater), the durability of the multilayer thin film at the heat treatment temperatures decreased, and $M_s$ decreased, and $K_u$ also decreased due to a decrease in the in-plane saturation magnetization.

On the other hand, FIGS. 6a and 6b are graphs showing saturation magnetization ($M_s$) (FIG. 6a) and PMA energy density ($K_u$) (FIG. 6b) as a function of the thickness ratio ($t_{Pt}/t_{Co}$) for [Co ($t_{Co}$ nm)/Pt (0.2 nm)]$_6$ (Co thickness ($t_{Co}$)= fixed to 0.2 nm, and Pt thickness ($t_{Pt}$)=changed) that is a cobalt and platinum-based multilayer thin film according to an embodiment of the present invention. As can be seen therein, the cobalt-platinum multilayer thin film having the inverted structure according to the present invention, that is, structures having a fixed, non-magnetic thin layer of 0.2 nm and gradually increasing, magnetic thin layer thicknesses greater than 0.2 nm, showed sufficient durability even in the heat treatment process, and showed significantly improved PMA properties compared to the structure of the prior art.

Also, before heat treatment and after heat treatment at about 500° C., the $K_u$ value was the highest in a cobalt-platinum multilayer thin film having an inverted structure of [Co (0.5 nm)/Pt (0.2 nm)]$_6$, and showed a tendency to decrease as the thickness of the magnetic thin layer increased. Particularly, this heat treatment temperature is a temperature very close to the heat treatment temperature (300 to 450° C.) that is used in current memory fabrication processes. In addition, such results definitely suggest that, when the thickness ratio of the layers in the multilayer thin film having the inverted structure according to the present invention is finely controlled, the PMA energy density of the multilayer thin film can be easily controlled, and a structure having stronger PMA properties can also be obtained.

INDUSTRIAL APPLICABILITY

As described above, the cobalt and platinum-based multilayer thin film having the inverted structure according to the present invention enables magnetic structures to ensure excellent thermal stability, and can be advantageously used in the fabrication and application of MRAMs that are to be substituted for DRAMs that are reaching their limit.

The invention claimed is:

1. A cobalt and platinum-based multilayer thin film having perpendicular magnetic anisotropy (PMA), comprising:
   thin cobalt layers and thin platinum layers alternately deposited over a substrate,
   wherein the cobalt and platinum-based multilayer thin film has an inverted structure in which a thickness of the thin cobalt layers is greater than that of the thin platinum layers,
   wherein a ratio of the thickness of the thin cobalt layers to that of the thin platinum layers in the cobalt and platinum-based multilayer thin film is more than 1:1 but less than 3:1, and
   wherein the cobalt and platinum-based multilayer thin film has a PMA energy density of $1\text{-}8\times10^6$ erg/cc at 300-450 Celsius degrees.

2. The cobalt and platinum-based multilayer thin film of claim 1, wherein the thickness of each of the thin platinum layers in the cobalt and platinum-based multilayer thin film ranges from 0.15 nm to 0.25 nm.

3. The cobalt and platinum-based multilayer thin film of claim 1, wherein the thin cobalt layer and the thin platinum layer in the cobalt and platinum-based multilayer thin film are deposited once or are alternately deposited 2-10 times.

4. The cobalt and platinum-based multilayer thin film of claim 1, wherein the substrate is one selected from the group consisting of a silicon substrate, a glass substrate, a sapphire substrate and a magnesium oxide substrate.

5. The cobalt and platinum-based multilayer thin film of claim 1, wherein a buffer layer and a seed layer are deposited between the substrate and the alternately deposited thin cobalt layer and thin platinum layer, and a protective layer is deposited on the alternately deposited thin cobalt layer and thin platinum layer.

6. The cobalt and platinum-based multilayer thin film of claim 5, wherein the buffer layer, the seed layer or the protective layer is made of Au, Cu, Pd, Pt, Ta, Ru, or an alloy of two or more thereof.

7. The cobalt and platinum-based multilayer thin film of claim 1, wherein a critical current value required for a perpendicular magnetization switching is reduced by forming in-plane magnetic anisotropy after heat treatment of the cobalt and platinum-based multilayer thin film.

8. A magnetic tunnel junction (MTJ) comprising:
   a cobalt and platinum-based multilayer thin film having perpendicular magnetic anisotropy (PMA),
   wherein the cobalt and platinum-based multilayer thin film comprises: thin cobalt layers and thin platinum layers alternately deposited over a substrate, wherein the cobalt and platinum-based multilayer thin film has an inverted structure in which a thickness of the thin cobalt layers is greater than that of the thin platinum layers, wherein a ratio of the thickness of the thin cobalt layers to that of the thin platinum layers in the cobalt and platinum-based multilayer thin film is more than 1:1 but less than 3:1, and wherein the cobalt and platinum-based multilayer thin film has a PMA energy density of $1-8\times10^6$ erg/cc at 300-450 Celsius degrees.

9. The MTJ of claim 8, wherein the cobalt and platinum-based multilayer thin film is applied as a free layer or a fixed layer in the MTJ by controlling a PMA energy density depending on a thickness ratio of the thin platinum layers and the thin cobalt layers.

10. A cobalt and platinum-based multilayer thin film having perpendicular magnetic anisotropy (PMA), comprising:

thin cobalt layers and thin platinum layers alternately deposited over a substrate, wherein the cobalt and platinum-based multilayer thin film has an inverted structure in which a thickness of the thin cobalt layers is greater than that of the thin platinum layers, wherein a ratio of the thickness of the thin cobalt layers to that of the thin platinum layers in the cobalt and platinum-based multilayer thin film is more than 1:1 but less than 3:1, wherein the cobalt and platinum-based multilayer thin film has a PMA energy density of $1-8\times10^6$ erg/cc at 300-450 Celsius degrees.

11. The cobalt and platinum-based multilayer thin film of claim 10, wherein the thickness of each of the thin platinum layers in the cobalt and platinum-based multilayer thin film ranges from 0.15 nm to 0.25 nm.

12. The cobalt and platinum-based multilayer thin film of claim 10, wherein the thin cobalt layer and the thin platinum layer in the cobalt and platinum-based multilayer thin film are deposited once or are alternately deposited 2-10 times.

13. The cobalt and platinum-based multilayer thin film of claim 10, wherein the substrate is one selected from the group consisting of a silicon substrate, a glass substrate, a sapphire substrate and a magnesium oxide substrate.

14. The cobalt and platinum-based multilayer thin film of claim 10, wherein a buffer layer and a seed layer are deposited between the substrate and the alternately deposited thin cobalt layer and thin platinum layer, and a protective layer is deposited on the alternately deposited thin cobalt layer and thin platinum layer.

15. The cobalt and platinum-based multilayer thin film of claim 1, wherein the cobalt and platinum-based multilayer thin film has a saturation magnetization (Ms) of 600-1050 emu/cc.

* * * * *